(12) United States Patent
Konishi et al.

(10) Patent No.: US 9,285,746 B2
(45) Date of Patent: Mar. 15, 2016

(54) ABNORMALITY MONITORING SYSTEM AND IMAGE FORMING APPARATUS

(71) Applicants: Takahiro Konishi, Kanagawa (JP); Yoshiaki Morita, Kanagawa (JP)

(72) Inventors: Takahiro Konishi, Kanagawa (JP); Yoshiaki Morita, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 4 days.

(21) Appl. No.: 14/447,544

(22) Filed: Jul. 30, 2014

(65) Prior Publication Data

US 2015/0043928 A1 Feb. 12, 2015

(30) Foreign Application Priority Data

Aug. 6, 2013 (JP) .................................. 2013-162851

(51) Int. Cl.
*G03G 15/00* (2006.01)
*G01R 31/00* (2006.01)

(52) U.S. Cl.
CPC ............ *G03G 15/55* (2013.01); *G03G 15/5004* (2013.01); *G01R 31/00* (2013.01)

(58) Field of Classification Search
CPC ..... G03G 15/55; G03G 15/5008; G03G 15/80; G01R 31/024
USPC ........................................ 399/36, 90; 324/511
See application file for complete search history.

(56) References Cited

FOREIGN PATENT DOCUMENTS

| JP | 2008-047996 | 2/2008 |
|---|---|---|
| JP | 2008-216548 | 9/2008 |

*Primary Examiner* — Erika J Villaluna
(74) *Attorney, Agent, or Firm* — Duft Bornsen & Fettig LLP (57) ABSTRACT

An abnormality monitoring system includes: an electronic component that outputs a lock signal of "High" when the electronic component stops functioning and outputs a lock signal of "Low" when the electronic component functions; a signal device that supplies power to the electronic component and outputs an ON operation signal instructing the electronic component to function and an OFF operation signal instructing the electronic component to stop functioning; a harness member that connects the electronic component and the signal device and transmits and receives a signal; and a monitor device that determines abnormality of the electronic component when the operation signal is ON and the lock signal is "Low", and determines abnormality of the harness member when the operation signal is OFF and the lock signal is "Low".

4 Claims, 5 Drawing Sheets

MECHANISM OF ABNORMALITY DETERMINATION (NEW)

| STATE OF ELECTRONIC COMPONENT | LOCK SIGNAL OUTPUT BY ELECTRONIC COMPONENT | DETERMINATION OF LOCK SIGNAL BY CONTROL BOARD | DETERMINATION OF ABNORMALITY BY CONTROL BOARD | |
|---|---|---|---|---|
| | | | OPERATION SIGNAL ON | OPERATION SIGNAL OFF |
| NORMAL OPERATION | Low | Low | NORMAL | NONE |
| ABNORMAL OPERATION OR STOP | High | High | ABNORMAL | NORMAL |
| HARNESS ABNORMALITY | NONE | Low | NORMAL | ABNORMAL |

FIG.6

ABNORMALITY MONITORING SYSTEM AND IMAGE FORMING APPARATUS

CROSS-REFERENCE TO RELATED APPLICATIONS

The present application claims priority to and incorporates by reference the entire contents of Japanese Patent Application No. 2013-162851 filed in Japan on Aug. 6, 2013.

BACKGROUND OF THE INVENTION

1. Field of the Invention

The present invention relates to an abnormality monitoring system for an electronic component to and from which signals related to power supply and drive control is input and output through a harness member, and an image forming apparatus.

2. Description of the Related Art

In a recent electrophotographic image forming apparatus, its structure and control system have been complicated because of the speed-up of functions, high resolution, downsizing of the apparatus, or the like. In particular, the number of electronic components installed, such as various types of drive motors for driving internal drive units, is increased, and drive control with complicated timing and the like becomes necessary for the electronic components.

When the drives of such a plurality of drive motors are simultaneously controlled and if a single control circuit (CPU) is used for drive control, an expensive and high-precision control circuit has to be used.

Figure 6:
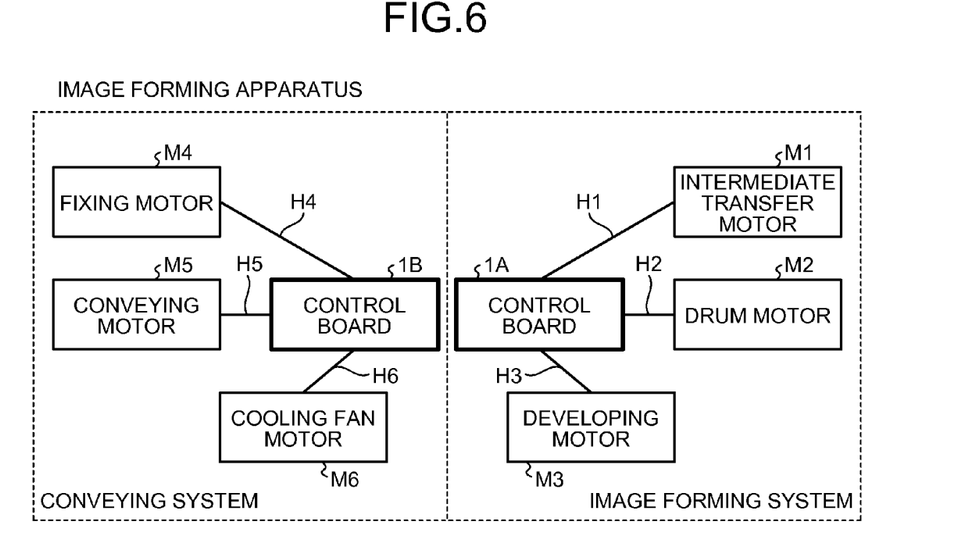
FIG. 6 is an explanatory diagram of a connection relation between each of control boards and drive motors in the image forming apparatus.

Therefore, in an image forming apparatus requiring complicated drive control, as illustrated in FIG. 6, for example, a control board with a control circuit is divided into a control board 1A for an image forming system and a control board 1B for a conveying system, both of which drive control the drive motors M1 to M6 in a unit manner.

For the drive motors M1 to M6 such as brushless DC motors as the electronic components, signals need to be simultaneously transmitted from the control board 1A to the drive motors M1 to M3 or from the control board 1B to the drive motors M4 to M6. Therefore, the control board 1A or 1B and the drive motors M1 to M6 are electrically connected to each other through respective harness members H1 to H6. In addition, the harness members H1 to H6 have to be routed along complicated paths inside the apparatus.

An image forming apparatus that monitors a fan lock signal and stops the fan when the fan is locked has been known (see, for example, Japanese Laid-open Patent Publication No. 2008-047996)

However, the image forming apparatus described in Japanese Laid-open Patent Publication No. 2008-047996 is designed only to detect a failure of the fan being an object to be controlled, and therefore abnormality of the harness members H1 to H6 as illustrated in FIG. 6 is not considered.

There is a need to provide an abnormality monitoring system capable of determining an abnormality of a harness member connecting an electronic component and a signal device and an image forming apparatus.

SUMMARY OF THE INVENTION

It is an object of the present invention to at least partially solve the problems in the conventional technology.

An abnormality monitoring system includes: an electronic component that outputs a lock signal of "High" when the electronic component stops functioning and outputs a lock signal of "Low" when the electronic component functions; a signal device that supplies power to the electronic component and outputs an ON operation signal instructing the electronic component to function and an OFF operation signal instructing the electronic component to stop functioning; a harness member that connects the electronic component and the signal device and transmits and receives a signal; and a monitor device that determines abnormality of the electronic component when the operation signal is ON and the lock signal is "Low", and determines abnormality of the harness member when the operation signal is OFF and the lock signal is "Low".

An image forming apparatus includes: a plurality of drive motors each of which outputs a lock signal of "High" when it stops and output a lock signal of "Low" when it is driven; a signal device that supplies power to the drive motors and outputs ON operation signals instructing to drive the drive motors and OFF operation signals instructing to stop the drive motors; harness members that connect the drive motors and the signal device and transmit and receive signals; and a monitor device that determines normality and abnormality of the drive motor and the harness member based on a combination of the operation signal and the lock signal. The monitor device determines that the drive motor is operating normally when the operation signal is ON and the lock signal is "Low", determines abnormality of the harness member when the operation signal is OFF and the lock signal is "Low", determines that the drive motor is operating abnormally when the operation signal is ON and the lock signal is "High", and determines that the drive motor is operating normally when the operation signal is OFF and the lock signal is "High".

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention will be explained below with reference to the accompanying drawings, by using an example of a printer dedicated machine as the image forming apparatus on which the abnormality monitoring system is installed.

Figure 1:
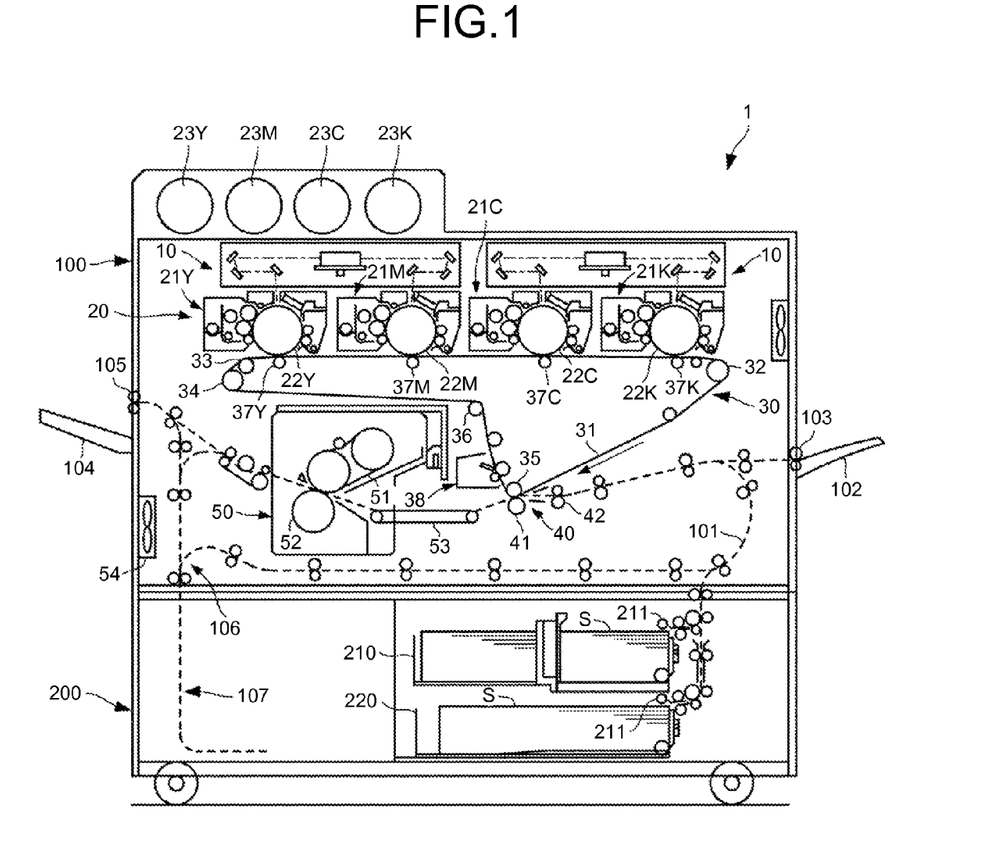
FIG. 1 is an explanatory diagram of a schematic configuration of an image forming apparatus that mounts an abnormality monitoring system according to an embodiment of the present invention.

As illustrated in FIG. 1, an image forming apparatus 1 on which the abnormality monitoring system according to the present embodiment is installed adopts a tandem intermediate transfer system. An apparatus body 100 of the image forming apparatus 1 includes an exposure device 10, an image forming device 20, an intermediate transfer device 30, a secondary transfer device 40, and a fixing device 50 in the order of an image forming process from its upper side. The apparatus body 100 includes a sheet feeding device 200 in its lower side.

The sheet feeding device 200 is provided at the lower-side of the apparatus body 100. In the present embodiment, the sheet feeding device 200 has drawer-type sheet feeding cassettes 210 and 220 arranged in two stages of upper and lower stages. The sheet feeding cassettes 210 and 220 are capable of storing recording sheets S such as recording paper. Sheet feeding rollers 211 and 221 are provided at upper sides of respective downstream ends of the sheet feeding cassettes 210 and 220, each of the sheet feeding rollers 211 and 221 delivering the recording sheets S stored in the sheet feeding rollers 211 and 221 one by one from the topmost sheet to feed it to a sheet conveying path 101 of the apparatus body 100.

The exposure device 10 irradiates a laser beam to the image forming device 20 based on image data received from a personal computer (PC) which is explained later. The image data includes various types of data such as the number of sets of printouts and aggregation setting, in addition to print data such as text data. Any exposure device having a known configuration can be used for the exposure device 10, and therefore detailed explanation thereof is omitted herein.

The image forming device 20 has image forming units 21Y, 21M, 21C, and 21K for colors of yellow, magenta, cyan, and black, respectively. In the following, the explanation is performed in such a manner that signs of Y, M, C, and K representing the colors are attached, as (Y, M, C, K) without the numbers, to respective signs of members. The image forming units 21 (Y, M, C, K) are arranged side by side in a four-series tandem system.

Each of the image forming units 21 (Y, M, C, K) is configured to arrange charging, development, transfer, cleaning, and discharging devices around each of drum-shaped image carriers 22 (Y, M, C, K) which is rotated counterclockwise in FIG. 1, and to execute each process in this order. The image forming units 21 (Y, M, C, K) are supplied with toners corresponding to the colors from toner bottles 23Y, 23M, 23C, and 23K, respectively.

At this time, the image carriers 22 (Y, M, C, K) are rotated by being driven by the drive motor (drum motor) M2. Furthermore, a toner supply system for supplying toners from the toner bottles 23 (Y, M, C, K) to the image carriers 22 (Y, M, C, K) via developing devices of the image forming units 21 (Y, M, C, K), respectively, is driven by being driven by the drive motor (developing motor) M3. Any image forming device having a known configuration can be used for the image forming device 20, and therefore detailed explanation thereof is omitted herein.

The intermediate transfer device 30 is configured such that an endless intermediate transfer belt 31 is stretched around a plurality of rollers 32 to 36 in a tension state and is rotationally moved counterclockwise as illustrated in the figure. The image forming units 21 (Y, M, C, K) are arranged, above the intermediate transfer belt 31, side by side in the horizontal direction in the figure along the rotational movement direction of the intermediate transfer belt 31.

The intermediate transfer device 30 has primary transfer rollers 37Y, 37M, 37C, and 37K that face the image carriers 22 (Y, M, C, K) of the image forming units 21 (Y, M, C, K) respectively across the intermediate transfer belt 31. The primary transfer rollers 37 (Y, M, C, K) transfer toner images formed on the image carriers 22 (Y, M, C, K) to the intermediate transfer belt 31.

In the present embodiment, among the rollers 32 to 36, the roller 32 at the right of the figure functions as a drive roller that is rotated by being driven by the drive motor (intermediate transfer motor) M1 and rotationally moves the intermediate transfer belt 31. Among the rollers 32 to 36, the rollers 33 and 34 at the left of the figure and the roller 36 at the center of the figure function as tension rollers that maintain the tension state of the intermediate transfer belt 31. Moreover, a belt cleaning device 38 is disposed near the roller 35 at the lower of the figure among the rollers 32 to 36, specifically, downstream of the secondary transfer device 40 in the rotational movement direction of the intermediate transfer belt 31. The belt cleaning device 38 removes residual toner, paper dust of the recording sheet, and the like remaining on the intermediate transfer belt 31 after the transfer of an image.

In the present embodiment, the secondary transfer device 40 uses the roller 35 as a secondary transfer counter roller to press a secondary transfer roller 41 against the roller 35, and applies a transfer electric field thereto, so that a toner image on the intermediate transfer belt 31 is transferred to the recording sheet S. Any secondary transfer device having a known configuration can be used for the secondary transfer device 40, and therefore detailed explanation thereof is omitted herein.

A registration roller 42 is disposed upstream of the secondary transfer device 40 in the conveying direction of the recording sheet S so as to align the trailing edge of the recording sheet S in the conveying direction and adjust a timing of image forming processing.

The fixing device 50 includes a belt-type heating unit 51 provided to face the front side of the sheet, a pressurizing unit 52 provided to face the rear side of the sheet and pressurizing the heating unit 51, and a conveyor belt 53 for conveying the recording sheet S between the heating unit 51 and the pressurizing unit 52. A cooling fan 54 is provided near the fixing device 50, for example, on an inner wall surface of the apparatus body 100 in order to suppress an increase in temperature inside the body around the fixing device 50.

The heating unit 51 increases the temperature to a fixing temperature by the heating from a heating source (not illustrated) and fixes the toner image transferred to the recording sheet S thereon. The heating unit 51 is rotationally moved by being driven by the drive motor (fixing motor) M4. The conveying rollers such as the conveyor belt 53 are rotationally moved or rotated by being driven by the drive motor (conveying motor) M5. The cooling fan 54 is rotated by being driven by the drive motor (cooling fan motor) M6. Any fixing device having a known configuration can be used for the fixing device 50, and therefore detailed explanation thereof is omitted herein.

Other than the sheet feeding cassettes 210 and 220, a sheet feeding tray 102 capable of storing recording sheets such as recording paper (not illustrated) is provided at one side face of the apparatus body 100. Each recording sheet stored in the sheet feeding tray 102 is fed to the sheet conveying path 101 by a sheet feeding roller 103.

The sheet conveying path 101 is configured such that a recording sheet S is fed from either one of the sheet feeding cassettes 210 and 220 or from the sheet feeding tray 102 toward a sheet ejection tray 104 provided at the other side face of the apparatus body 100 while being subjected to image forming processing. A sheet ejection roller 105 is provided above the sheet ejection tray 104 in order to stack recording sheets S subjected to the image forming processing on the sheet ejection tray 104.

The sheet conveying path 101 connects to a both-side conveying path 106 for re-conveying the recording sheet S to the sheet conveying path 101 after an image is fixed on its one side when the image forming processing is performed on both sides of the recording sheet S. At this time, the both-side conveying path 106 is branched from the sheet conveying path 101 at the downstream of the fixing device 50 and meets the sheet conveying path 101 at the upstream of the registration roller 42.

When the recording sheet S is simply conveyed from the sheet conveying path 101 to meet again the sheet conveying path 101 via the both-side conveying path 106, the front and rear of the recording sheet S cannot be reversed. Therefore, a switchback conveying path 107 for reversing the front and rear of the recording sheet S is provided in a midway of the both-side conveying path 106.

In this configuration, when image data is transmitted to the apparatus body 100 and an image forming start signal is received, the roller 32 is rotationally driven by the drive motor M1 to rotationally move the intermediate transfer belt 31 while causing the other rollers 33 to 36 to rotate in a driven manner.

At the same time, the exposure device 10 irradiates a laser beam to each of the image carriers 22 (Y, M, C, K) based on the received image data, and forms single-color images of yellow, magenta, cyan, and black on the image carriers 22 (Y, M, C, K), respectively. The single-color images formed on the image carriers 22 (Y, M, C, K) are sequentially transferred to the intermediate transfer belt 31 by the primary transfer rollers 37 (Y, M, C, K) respectively in synchronization with the rotational movement of the intermediate transfer belt 31, to form a composite full-color toner image on the surface of the intermediate transfer belt 31.

The recording sheet S is fed from either one of the sheet feeding cassettes 210 and 220 or from the sheet feeding tray 102 to the sheet conveying path 101 and is caused to abut against the registration roller 42.

The registration roller 42 is rotated by matching the timing with the toner image on the intermediate transfer belt 31, the recording sheet S is fed in between the intermediate transfer belt 31 and the secondary transfer device 40, and the toner image is transferred to the recording sheet S by the secondary transfer device 40, so that the toner image is recorded thereon.

The recording sheet S to which the image is transferred is conveyed by the secondary transfer device 40 to be fed into the fixing device 50, is heated and pressed so as to fix the toner image on the recording sheet S, and thereafter, the recording sheet S is ejected by the sheet ejection roller 105 to be stacked on the sheet ejection tray 104.

The intermediate transfer belt 31 after the transfer of the image is prepared for another image formation using the image forming device 20 by removing residual toner, paper dust, and the like remaining on the intermediate transfer belt 31 after the transfer of the image using the belt cleaning device 38.

Figure 2:
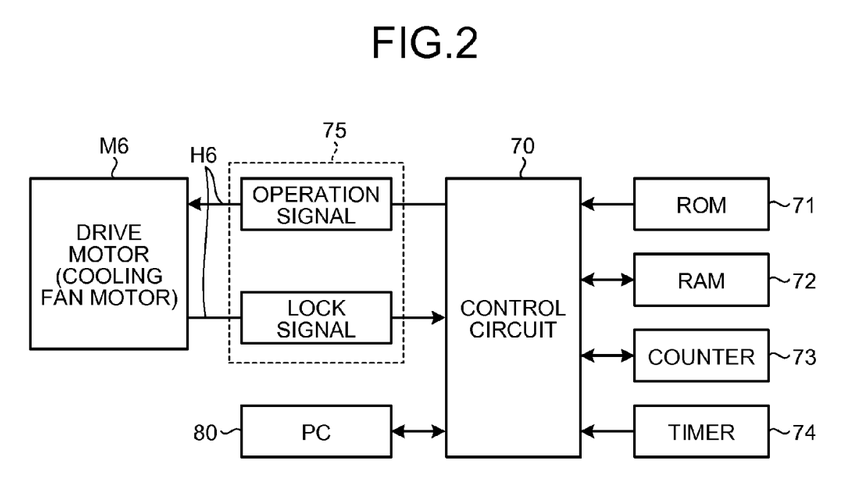
FIG. 2 is a block diagram of the abnormality monitoring system according to the embodiment of the present invention.

On the other hand, as explained above, the drives of the various drive systems such as the drive motors M1 to M6 and other control systems are controlled by the control circuit (CPU) mounted on the control board 1A (1B). FIG. 2 depicts an example of the control systems. The following explanation is performed by using an example of controlling the drive motor (cooling fan motor) M6 for driving the cooling fan 54 using a control circuit 70 mounted on the control board 1B.

The control circuit 70 processes the image data and the various types of control data according to the programs stored in a read-only memory (ROM) 71. The control circuit 70 also controls units (units of the fixing system herein) related to the image forming processing.

When receiving the image data output from a personal computer (PC) 80, the control circuit 70 temporarily stores the image data in a random access memory (RAM) 72, and executes the image forming processing according to the programs stored in the ROM 71. Therefore, the RAM 72 can be used as a work memory for the image forming processing, a buffer for managing and temporarily storing print data included in the image data for each recording sheet, a bitmap memory for converting the print data to a print pattern and storing the print pattern as video data, and the like. A nonvolatile RAM capable of storing various data desired to be held even when a main power supply (not illustrated) is turned off is used for the RAM 72.

The control circuit 70 is connected with a counter 73 for counting the number of detection times of a lock signal explained later, and with a timer 74 for measuring a predetermined time. The timer 74 has also a time function for managing an image forming processing time and the like.

Furthermore, the control circuit 70 controls a motor driver 75 for the drive motor M6. The motor driver 75 is connected to the drive motor M6 through the harness H6, and supplies power from a power supply (not illustrated) to the drive motor M6. The motor driver 75 drives and stops the drive motor M6 based on an ON and OFF drive signal instructing to drive and stop the drive motor M6 output from the control circuit 70. Moreover, the drive motor M6 outputs a lock signal related to the drive to the motor driver 75.

The lock signal mentioned here indicates a signal that changes from a "High" lock signal to a "Low" lock signal when a rotational speed of the drive motor M6 reaches a threshold being a set speed (rated speed) around a target speed.

Therefore, the motor driver 75 outputs the "Low" lock signal to the control circuit 70 when the drive motor M6 is rotated at the rated speed. The motor driver 75 also outputs the "High" lock signal to the control circuit 70 when the drive motor M6 is rotated at any speed other than the rated speed (including the stop).

When the lock signal output from the motor driver 75 changes from the "High" to "Low", the control circuit 70 performs control so as to change drive bias of the drive motor M6 from an activation mode for increasing a motor speed to a rated speed control mode for stabilizing the speed to the target speed. When the motor driver 75 provides motor drive control using phase locked loop (PLL) control, the frequency of a speed detection pulse (feedback pulse) in proportion to the rotational speed of the drive motor M6 becomes substantially the same frequency as that of a pulse (speed command pulse) for specifying a target speed. Furthermore, when the phase difference falls within a predetermined range, the lock signal changes from "High" to "Low". At this time, the rotational speed of the drive motor M6 becomes substantially the same as the target speed (threshold as the set speed). In a case of the feedback control not using the PLL control, the lock signal changes from "High" to "Low", in order to suppress motor speed overshoot, when a rotational speed signal indicating the rotational speed of the drive motor M6 reaches the threshold which is the set speed slightly lower than the target speed. In response to this change, the control circuit 70 changes the motor driver 75 from the activation mode to the rated speed control mode.

In the present embodiment, the drive motor M6 as the electronic component outputs the "High" lock signal, other than a revolution signal, to the motor driver 75 when it stops functioning, and outputs the "Low" lock signal when it functions (when it is driven), simply in the sense of whether the drive motor M6 is driven. The motor driver 75 as the signal device supplies power to the drive motor M6 and also outputs an ON operation signal instructing the drive motor M6 to function and an OFF operation signal instructing the drive motor M6 to stop functioning to the drive motor M6 based on the control signal of the control circuit 70. Moreover, the motor driver 75 as the signal device outputs the "High" lock signal when stops functioning and outputs the "Low" lock signal when functions (when driven) to the control circuit 70, what is indicated by the signals including whether the revolution in the drive of the drive motor M6 is appropriate (rated rotation) or not. The drive motor M6 and the motor driver 75 are electrically connected to each other through the harness member H6 that transmits and receives signals including power supply.

A specific example of an abnormality determination routine in the abnormality monitoring system using the control circuit 70 will be explained next with reference to FIG. 3 and FIG. 4.

Figure 3:
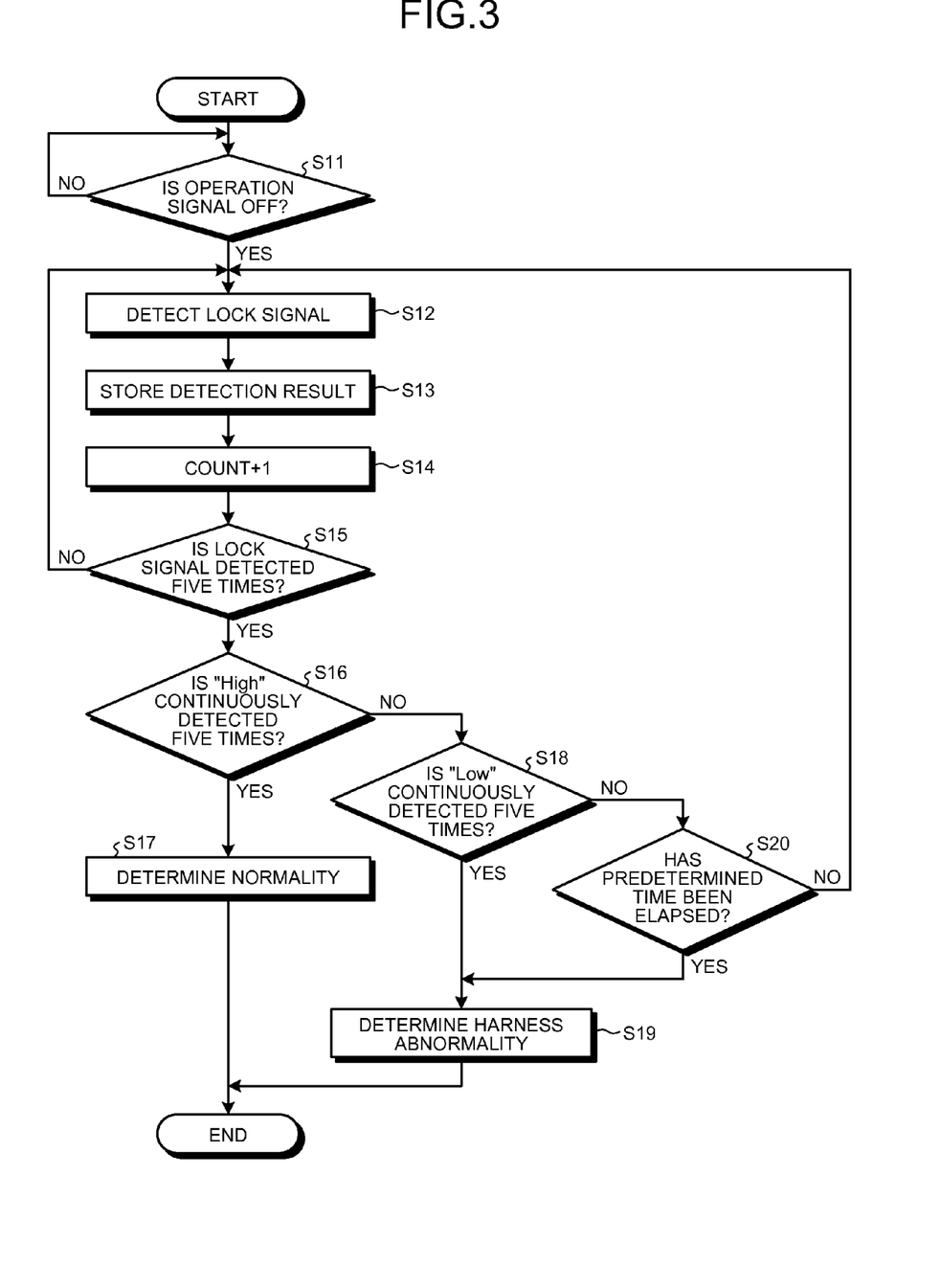
FIG. 3 is a flow diagram of an abnormality determination routine when an operation signal is OFF in the abnormality monitoring system according to the embodiment of the present invention.

FIG. 3 is a flow diagram of a determination routine when the main power supply is ON and, for example, in a standby mode (power-saving mode), i.e., in an operation signal OFF state in which the operation signal is not output from the control circuit 70 to the motor driver 75.

In the present embodiment, when the number of revolutions of the drive motor M6 is apart from a target value by ±5% or more including when the drive motor M6 stops functioning, then it is determined that the drive motor M6 is rotated at any speed other than the rated speed, and the motor driver 75 outputs the "High" lock signal to the control circuit 70. Furthermore, when the number of revolutions of the drive motor M6 is within ±5% from the target value, then it is determined that the drive motor M6 is rotated at the rated speed, and the motor driver 75 outputs the "Low" lock signal to the control circuit 70.

At Step S11, the control circuit 70 determines whether the operation signal is OFF, proceeds to Step S12 when the operation signal is OFF, and performs monitoring by continues this routine when the operation signal is not OFF.

At Step S12, the control circuit 70 detects the lock signal output from the motor driver 75 and proceeds to Step S13.

At Step S13, the control circuit 70 stores the lock signal detected at Step S12 in the RAM 72 and proceeds to Step S14. The control circuit 70 starts counting the timer 74 when first receiving the lock signal at Step S12.

At Step S14, the control circuit 70 increments the count value of the counter 73 by one and proceeds to Step S15.

At Step S15, the control circuit 70 determines whether the lock signal is detected five times based on the count value of the counter 73. When the lock signal is detected five times, then the control circuit 70 proceeds to Step S16. When the lock signal is not detected five times, the control circuit 70 loops back to Step S12, and then repeats the routine until the lock signal is detected five times.

At Step S16, the control circuit 70 determines whether all the five lock signals stored in the RAM 72 are "High", that is, whether the "High" lock signal is continuously detected five times. When the "High" lock signal is continuously detected five times, then the control circuit 70 proceeds to Step S17. When the "High" lock signal is not continuously detected five times, then the control circuit 70 proceeds to Step S18.

The control circuit 70 determines the operation signal OFF state, that is, determines that the drive motor M6 does not go out of control at Step S16 based on 5-time continuous detection of the "High" lock signal, and performs normality determination processing at Step S17.

As the normality determination processing, the control circuit 70 maintains the standby mode, for example. The detection of the lock signal is not necessarily performed all the time during the OFF period of the operation signal, such that one detection is performed every 10 msec based on the counting of the timer 74 and if the 5-time continuous detection is finished, then another continuous detection is performed after the elapse of a predetermined time (e.g., after one hour).

At Step S18, the control circuit 70 determines whether all the five lock signals stored in the RAM 72 are "Low", that is, whether the "Low" lock signal is continuously detected five times.

At this time, in this routine assuming the drive signal OFF state, that is, assuming that the drive motor M6 is not driven, the control circuit 70 receives the "High" lock signal if the drive motor M6 is obviously driven even if the number of revolutions is not normal.

Moreover, in this routine assuming that the drive motor M6 is not driven, it is almost impossible that the drive motor M6 is rotated at the rated speed, that is, that the control circuit 70 receives the "Low" lock signal.

Therefore, it follows that the control circuit 70 does not practically receive, at Step S12, both the "High" lock signal indicating the abnormality of the drive motor M6 and the "Low" lock signal indicating the normality of the drive motor M6. The control circuit 70 then determines that the "Low" lock signal is received at Step S12 while assuming that the motor driver 75 does not receive even an indication that the rotational speed signal is "0" (=stop) from the drive motor M6.

Thereby, when the "Low" lock signal is continuously detected five times at Step S18, the control circuit 70 proceeds to Step S19. When the "Low" lock signal is not continuously detected five times, the control circuit 70 proceeds to Step S20.

The control circuit 70 determines that a disconnection or the like occurs in the harness member H6 at Step S19 based on the 5-time continuous detection of the "Low" lock signal at Step S18, and performs harness abnormality determination processing.

As the harness abnormality determination processing, the control circuit 70 displays a message such as serviceman call indicating a request of repair (e.g., replacement of harness) on a display panel (not illustrated) provided in the personal computer 80 or the apparatus body 100, for example.

At Step S20, the control circuit 70 determines whether the counting of the timer 74 that starts counting at the time of first receiving the lock signal at Step S12 reaches a predetermined time (e.g., 250 msec). When the counting of the timer 74 does not reach the predetermined time, then the control circuit 70 loops back to Step S12 and repeats the routine. When the counting reaches the predetermined time, then the control circuit 70 proceeds to Step S19 and performs the harness abnormality determination.

Here, it follows that the control circuit 70 receives the "High" lock signal at least once every 5-time detection of the lock signal because "No" determination is made at Step S16 and "No" determination is made at Step S18.

Therefore, a time that is longer than a time (50 msec) during which continuous detection is performed five times and that allows a plurality of loops (e.g., five sets) is set to the predetermined time of the timer 74. Thereby, the control circuit 70 may continuously receive the "High" lock signal five times once among the five sets if the drive motor M6 is obviously abnormal. On the other hand, the control circuit 70 does not determine that the "Low" lock signal is continuously received five times, and therefore determines that a contact failure or the like occurs in the harness member H6 also in this case. The control circuit 70 then performs the harness abnormality determination processing at Step S19.

By assuming a case in which the operation signal is changed from ON to OFF and is then changed again to ON, the control circuit 70 does not perform the abnormality determination routine within a predetermined time (e.g., 1000 msec) since the change of the operation signal from ON to OFF.

When the state in which the operation signal is ON and the drive motor M6 is rotated at the rated speed is changed to the operation signal OFF state, the drive motor M6 decelerates and stops within about 500 msec. When the operation signal is changed from OFF to ON and the drive motor M6 is driven, the drive motor M6 reaches the rated speed within about 750 msec. When the abnormality determination routine is performed immediately in response to change of the operation signal to ON or OFF, the control circuit 70 receives the lock signal based on the number of revolutions during deceleration or acceleration, which causes erroneous determination. Therefore, to avoid the erroneous determination, it is configured not to perform abnormality determination immediately after the operation signal is changed to ON or OFF.

Figure 4:
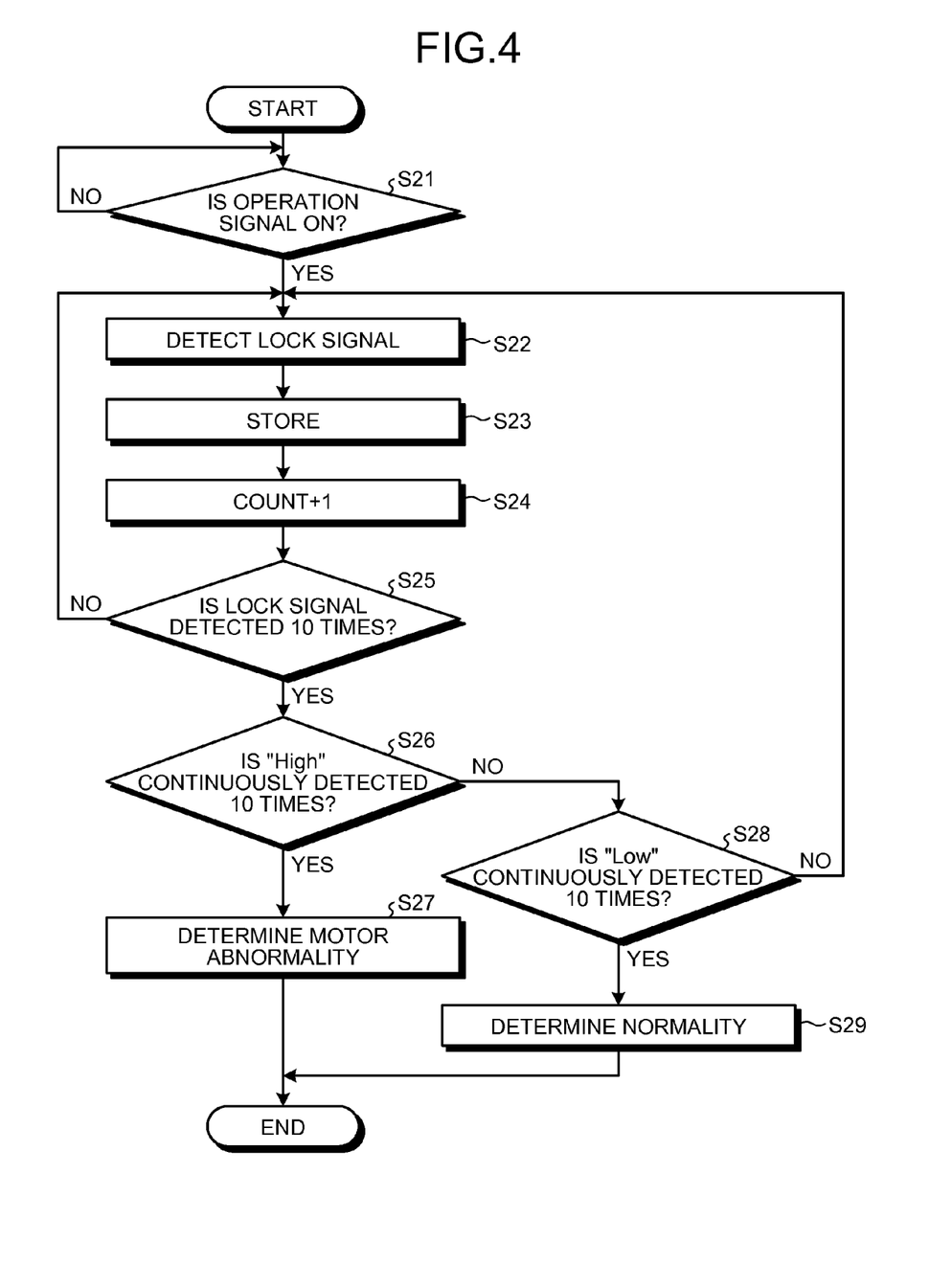
FIG. 4 is a flow diagram of an abnormality determination routine when the operation signal is ON in the abnormality monitoring system according to the embodiment of the present invention.

FIG. 4 is a flow diagram of a specific abnormality determination routine when the main power supply is ON and in the operation signal ON state in which the operation signal is output from the control circuit 70 to the motor driver 75.

At Step S21, the control circuit 70 determines whether the operation signal is ON, proceeds to Step S22 when the operation signal is ON, and performs monitoring by continuing the routine when the operation signal is not ON.

At Step S22, the control circuit 70 detects the lock signal output from the motor driver 75 and proceeds to Step S23.

At Step S23, the control circuit 70 stores the lock signal detected at Step S22 in the RAM 72 and proceeds to Step S24.

At Step S24, the control circuit 70 increments the count value of the counter 73 by one and proceeds to Step S25.

At Step S25, the control circuit 70 determines whether the lock signal is detected 10 times based on the count value of the counter 73. When the lock signal is detected 10 times, then the control circuit 70 proceeds to Step S26. When the lock signal is not detected 10 times, the control circuit 70 loops back to Step S22, and then repeats the routine until the lock signal is detected 10 times.

At Step S26, the control circuit 70 determines whether all the 10 lock signals stored in the RAM 72 are "High", that is, whether the "High" lock signal is continuously detected 10 times. When the "High" lock signal is continuously detected 10 times, then the control circuit 70 proceeds to Step S27. When the "High" lock signal is not continuously detected 10 times, then the control circuit 70 proceeds to Step S28.

The control circuit 70 determines that the drive motor M6 is not normally operating at Step S26 based on the 10-time continuous detection of the "High" lock signal, and performs motor abnormality determination processing at Step S27.

As the motor abnormality determination processing, the control circuit 70 displays a message such as serviceman call indicating a request of repair (e.g., replacement of motor) on a display panel (not illustrated) provided in the personal computer 80 or the apparatus body 100, for example.

At Step S28, the control circuit 70 determines whether all the 10 lock signals stored in the RAM 72 are "Low", that is, whether the "Low" lock signal is continuously detected 10 times. When the "Low" lock signal is continuously detected 10 times at Step S28, the control circuit 70 proceeds to Step S29. When the "Low" lock signal is not continuously detected 10 times, the control circuit 70 loops back to Step S22, and then repeats the routine.

The control circuit 70 determines that the drive motor M6 is normally operating at Step S29 based on 10-time continuous detection of the "Low" lock signal at Step S28, and performs the normality determination processing.

As the normality determination processing, the control circuit 70 performs the image forming processing according to the program stored in the ROM 71 installed in the apparatus body 100 based on, for example, detection results of various sensors and the like.

As explained above, in the present embodiment, the image forming apparatus 1 includes the abnormality monitoring system that includes the drive motors M1 to M6 that output the "High" lock signal when they stop functioning and output the "Low" lock signal when they function (when they are driven), the motor driver 75 that supplies the power to the drive motors M1 to M6 and outputs the ON operation signals instructing the drive motors M1 to M6 to function and the OFF operation signals instructing the drive motors M1 to M6 to stop functioning, the harness members H1 to H6 that connect the respective drive motors M1 to M6 and the motor driver 75 and transmit or receive signals, and the control circuit 70 that determines that the drive motor M1 to M6 is normal when the operation signal is ON and the lock signal is "Low" and determines that the harness member H1 to H6 is abnormal when the operation signal is OFF and the lock signal is "Low".

Contrary to the present embodiment, when the drive motors M1 to M6 output the "Low" lock signal when they stop functioning and output the "High" lock signal when they function (when they are driven), the control circuit 70 cannot determine the abnormality of the harness member H1 to H6 even if the "Low" lock signal is received because the control circuit 70 cannot discriminate whether it indicates the abnormality of the harness member H1 to H6 or indicates that the drive motor M1 to M6 stops functioning.

In the present embodiment, on the other hand, by receiving the "Low" lock signal, the control circuit 70 can at least determine that the drive motor M1 to M6 does not stop functioning. By additionally taking into consideration ON and OFF of the operation signal, the abnormality of the harness member H1 to H6 can be determined when the operation signal is OFF.

The control circuit 70 determines the abnormality of the drive motor M1 to M6 when the operation signal is ON and the lock signal is "High". Furthermore, the control circuit 70 determines the normality of the drive motor M1 to M6 when the operation signal is OFF and the lock signal is "High". The control board 1A and the control board 1B, on which the control circuit 70 is mounted, are connected to the harness members H1 to H3 for the drive motors M1 to M3 and to the harness members H1 to H3 for the drive motors M4 to M6, respectively.

Figure 5:
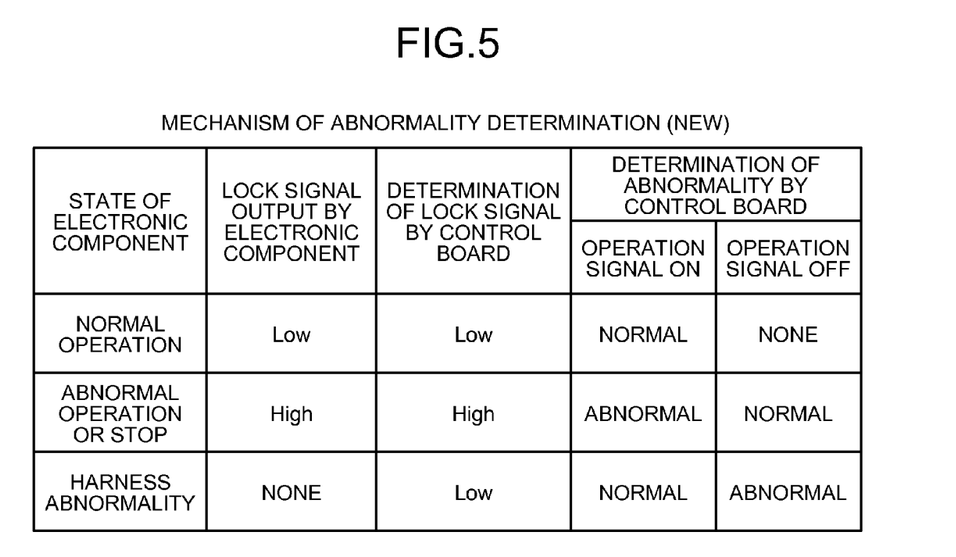
FIG. 5 is a diagram of a list of abnormality determination results in the abnormality monitoring system according to the embodiment of the present invention.

Thus, as illustrated in FIG. 5, the control circuit 70 monitors the lock signal at the time of ON and OFF of the operation signal. The control circuit 70 determines harness abnormality when the operation signal is OFF and the lock signal is "Low", and determines the normality of the drive motor M6 when the operation signal is ON and the lock signal is "Low".

Therefore, the normality and the abnormality of the drive motor M6 and the harness member H6 can be determined separately between the drive motor M6 and the harness member H6, which makes it possible to contribute reduction in the time required for dealing with the abnormality.

As illustrated in FIG. 5, the control circuit 70 determines that the drive motor M6 is operating abnormally when the operation signal is ON and the lock signal is "High", and determines that the drive motor M6 is operating normally when the operation signal is OFF and the lock signal is "High".

In this way, the image forming apparatus 1 on which the abnormality monitoring system according to the present embodiment is installed is capable of separately determining whether the abnormality determination result is the abnormality of the harness member or the abnormality of the drive motor M6 as the electronic component, which makes it possible to contribute reduction in the time required for dealing with the abnormality.

In the image forming apparatus 1 on which the abnormality monitoring system according to the present embodiment is installed, an image reader or an automatic document feeder (ADF) for a copying function can be installed as an option at, for example, an upper side of the apparatus body 100. Likewise, a finisher device such as a sorter device and a stapler device can be installed as an option at a side of the apparatus body 100. Therefore, the image forming apparatus 1 according to the present embodiment is not limited to a printer dedicated machine, and may be a multifunction peripheral including a copier function and a facsimile function.

In the image forming apparatus 1 on which the abnormality monitoring system according to the present embodiment is installed, the drive motors M1 to M6 are only examples. Therefore, the present invention can be applied to the whole of connections between various types of drive motors, such as a drive motor for a screw to convey waste toner of the belt cleaning device 38 to a predetermined position of the apparatus body 100, and harness members used for power supplies to the drive motors. Moreover, the present invention can be applied to the whole of connections between electronic components and the control boards through respective harness members that monitor the states of the electronic components, like a connection between a temperature sensor for monitoring a heating temperature of the heating source in the heating unit 51 and the harness member for supplying power to the heating source.

As explained above, the abnormality monitoring system and the image forming apparatus according to an embodiment have effects that the abnormality of a harness member connecting an electronic component and a signal device can be determined, and are useful for any abnormality monitoring system for an electronic component to and from which signals related to power supply and drive control are input and output through a harness member and for any image forming apparatus.

According to an embodiment, it is possible to provide the abnormality monitoring system capable of determining the abnormality of a harness member connecting an electronic component and a signal device, and the image forming apparatus.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An abnormality monitoring system comprising:
   an electronic component that outputs a lock signal of "High" when the electronic component stops functioning and outputs a lock signal of "Low" when the electronic component functions;
   a signal device that supplies power to the electronic component and outputs an ON operation signal instructing the electronic component to function and an OFF operation signal instructing the electronic component to stop functioning;
   a harness member that connects the electronic component and the signal device and transmits and receives a signal; and
   a monitor device that determines abnormality of the electronic component when the operation signal is ON and the lock signal is "High", and determines abnormality of the harness member when the operation signal is OFF and the lock signal is "Low".

2. The abnormality monitoring system according to claim 1, wherein the monitor device determines the normality of the electronic component when the operation signal is OFF and the lock signal is "High".

3. The abnormality monitoring system according to claim 1, wherein the monitor device is connected to the harness member for each of a plurality of electronic components.

4. An image forming apparatus comprising:
   a plurality of drive motors each of which outputs a lock signal of "High" when it stops and output a lock signal of "Low" when it is driven;
   a signal device that supplies power to the drive motors and outputs ON operation signals instructing to drive the drive motors and OFF operation signals instructing to stop the drive motors;
   harness members that connect the drive motors and the signal device and transmit and receive signals; and
   a monitor device that determines normality and abnormality of a drive motor and a harness member based on a combination of an operation signal and a lock signal associated therewith, wherein the monitor device:
   determines that the drive motor is operating normally when the operation signal is ON and the lock signal is "Low",
   determines abnormality of the harness member when the operation signal is OFF and the lock signal is "Low",
   determines that the drive motor is operating abnormally when the operation signal is ON and the lock signal is "High", and
   determines that the drive motor is operating normally when the operation signal is OFF and the lock signal is "High".

* * * * *